(12) United States Patent
Phan et al.

(10) Patent No.: US 12,378,879 B2
(45) Date of Patent: Aug. 5, 2025

(54) METHODS FOR PREDICTING FORMATION PROPERTIES

(71) Applicant: ARAMCO SERVICES COMPANY, Houston, TX (US)

(72) Inventors: Dung T. Phan, Brookshire, TX (US); Chao Liu, Brookshire, TX (US); Younane N. Abousleiman, Norman, OK (US)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 450 days.

(21) Appl. No.: 17/656,814

(22) Filed: Mar. 28, 2022

(65) Prior Publication Data

US 2023/0304397 A1   Sep. 28, 2023

(51) Int. Cl.
*E21B 49/00*  (2006.01)
*E21B 49/02*  (2006.01)
*G06F 30/20*  (2020.01)

(52) U.S. Cl.
CPC ............ *E21B 49/005* (2013.01); *E21B 49/02* (2013.01); *G06F 30/20* (2020.01); *E21B 2200/20* (2020.05)

(58) Field of Classification Search
None
See application file for complete search history.

(56) References Cited

U.S. PATENT DOCUMENTS

| | | |
|---|---|---|
| 6,691,037 B1 | 2/2004 | Poe et al. |
| 2007/0016389 A1 | 1/2007 | Ozgen |
| 2009/0065253 A1* | 3/2009 | Suarez-Rivera ........ E21B 43/17 166/250.1 |
| 2010/0000792 A1* | 1/2010 | Alberty .................. E21B 49/02 175/58 |
| 2010/0004864 A1 | 1/2010 | Thorne |
| 2011/0061860 A1* | 3/2011 | Dean ...................... G01V 20/00 703/2 |

(Continued)

OTHER PUBLICATIONS

Chang, C. et al., "Empirical relations between rock strength and physical properties in sedimentary rocks", Journal of Petroleum Science and Engineering 51.3-4, 223-237, 2006 (15 pages).

(Continued)

*Primary Examiner* — Shelby A Turner
*Assistant Examiner* — Brandon J Becker
(74) *Attorney, Agent, or Firm* — Osha Bergman Watanabe & Burton LLP

(57) ABSTRACT

A method for predicting a formation property of a formation, including the steps of: drilling a first well that penetrates the formation, obtaining well properties from the first well, determining a measured formation property from the first well, determining a correlation function that estimates a predicted formation property from the well properties, wherein the correlation function comprises coefficients, calibrating the correlation function by modifying the coefficients until the predicted formation property best matches the measured formation property, drilling a second well that penetrates the formation, obtaining well properties from the second well, determining the formation property from the second well by applying the correlation function with the modified coefficients to the well properties.

16 Claims, 8 Drawing Sheets

(56) References Cited

U.S. PATENT DOCUMENTS

| | | | | |
|---|---|---|---|---|
| 2013/0346048 A1* | 12/2013 | Crawford | ............... | G01V 20/00 |
| | | | | 703/10 |
| 2014/0100797 A1* | 4/2014 | Acharya | ............ | G01N 33/0031 |
| | | | | 702/24 |
| 2014/0190691 A1* | 7/2014 | Vinegar | ................... | C10G 9/24 |
| | | | | 166/272.1 |
| 2014/0208825 A1* | 7/2014 | Holba | ................ | G01N 30/8682 |
| | | | | 73/23.35 |
| 2014/0351183 A1* | 11/2014 | Germain | ................ | E21B 44/00 |
| | | | | 706/12 |
| 2016/0364654 A1* | 12/2016 | Gevirtz | ................. | G01V 20/00 |
| 2017/0074772 A1* | 3/2017 | Walls | .................... | G01N 33/24 |
| 2019/0264559 A1 | 8/2019 | Han et al. | | |
| 2020/0317984 A1* | 10/2020 | Jamison | ................ | C09K 8/487 |

OTHER PUBLICATIONS

Horsrud, P., "Estimating Mechanical Properties of Shale From Empirical Correlations", SPE Drill & Compl, 16, 68-73, 2001 (6 pages).

Lakshmivarahan, S. et al., "Forward Sensitivity Approach to Dynamic Data Assimilation", Advances in Meteorology, vol. 2010, 2010 (13 pages).

Al, M, "Shale Stability: Drilling Fluid Interaction and Shale Strength", SPE 54356, paper presented at the SPE Asia Pacific Oil and Gas Conference and Exhibition, Jakarta, Indonesia, 1999 (10 pages).

Sherimkulova, Asel, "Collecting, Preparing, and Synthesizing Well Log Data for Subsurface Mapping: Example from the Bakken Formation", Graduate Theses & Non-Theses, Montana Tech, 2016 (73 pages).

* cited by examiner

METHODS FOR PREDICTING FORMATION PROPERTIES

BACKGROUND

Formation properties are required for computational models to support many operations in the lifecycle of a well. For example, wellbore stability models require formation properties to plan an optimal well trajectory and a mud program that minimizes the instabilities of the well. Similarly, wellbore strengthening models need formation properties to recommend an optimal lost circulation material (LCM) blend to mitigate mud loss. LCMs are additives introduced to the drilling fluid when there are signs of inadvertent returns or the loss of drilling fluid into the formation.

However, it is challenging to obtain formation properties at thousands of feet under the ground of the formation, especially when a wellbore has not been drilled in the formation yet. As such, empirical correlations have been widely used to predict formation properties from well logs. A correlation is a mathematical function that maps the inputs, e.g., sonic transit time (dt), to a formation property (output), e.g., unconfined compressive strength (UCS). The correlation function also has coefficients. Often, when a correlation is first introduced, the coefficients are determined using the data from a specific region. Therefore, various software are used to import and visualize well logs and to estimate formation properties from well logs using well-known empirical correlation equations.

When that correlation is used for wells in a different region, it normally needs to be calibrated. The calibration process modifies the coefficients of a correlation such that the correlation output (predicted formation property value) best matches the measured data (true formation property value). The calibration can be done using techniques such as curve fitting or regression analysis in software such as Matlab and Excel. Each correlation and the accompanying calibration need to be specifically programmed. This process can become cumbersome, especially when it is desired to calibrate a group of correlations to see which one performs the best. Available software can hard-code popular correlations and calibration methods.

Accordingly, there exists a need for flexible methods that allow specifying any arbitrary correlations and automatically calibrating them.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a method for predicting a formation property of a formation, comprising the steps of: drilling a first well that penetrates the formation, obtaining well properties from the first well, determining a measured formation property from the first well, determining a correlation function that estimates a predicted formation property from the well properties, wherein the correlation function comprises coefficients, calibrating the correlation function by modifying the coefficients until the predicted formation property best matches the measured formation property, drilling a second well that penetrates the formation, obtaining well properties from the second well, determining the formation property from the second well by applying the correlation function with the modified coefficients to the well properties.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency. The following figures are included to illustrate certain aspects of the embodiments, and should not be viewed as exclusive embodiments. The subject matter disclosed is amenable to considerable modifications, alterations, combinations, and equivalents in form and function, as will occur to those skilled in the art and having the benefit of this disclosure.

DETAILED DESCRIPTION

In the following discussion, numerous specific details are set forth to provide a thorough understanding of the present disclosure. However, it will be obvious to those skilled in the art that embodiments of the present disclosure can be practiced without such specific details. Additionally, for the most part, details concerning well drilling, reservoir testing, well completion and the like have been omitted inasmuch as such details are not considered necessary to obtain a complete understanding of the present disclosure, and are considered to be within the level of skill of persons having ordinary skill in the relevant art.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Embodiments disclosed herein relate to methods to (i) specify and store correlations in a database, (ii) automatically calibrate a correlation, (iii) automatically calibrate a group of correlations and rank them based on their performances, and (iv) estimate formation properties using the best calibrated correlation. These methods are implemented in software, allowing users to add correlations to the database, load well log and core data, then automatically calibrate the correlations, rank them, and display the results.

Embodiments of the present disclosure may provide at least one of the following advantages. Correlation functions need to be calibrated using field or lab measurements. There is also no need for a software that calibrates correlation functions. The calibration of the correlation function is automated and does not need a user to write calibration code and is not limited to hard-coded correlations in the software.

Figure 1:
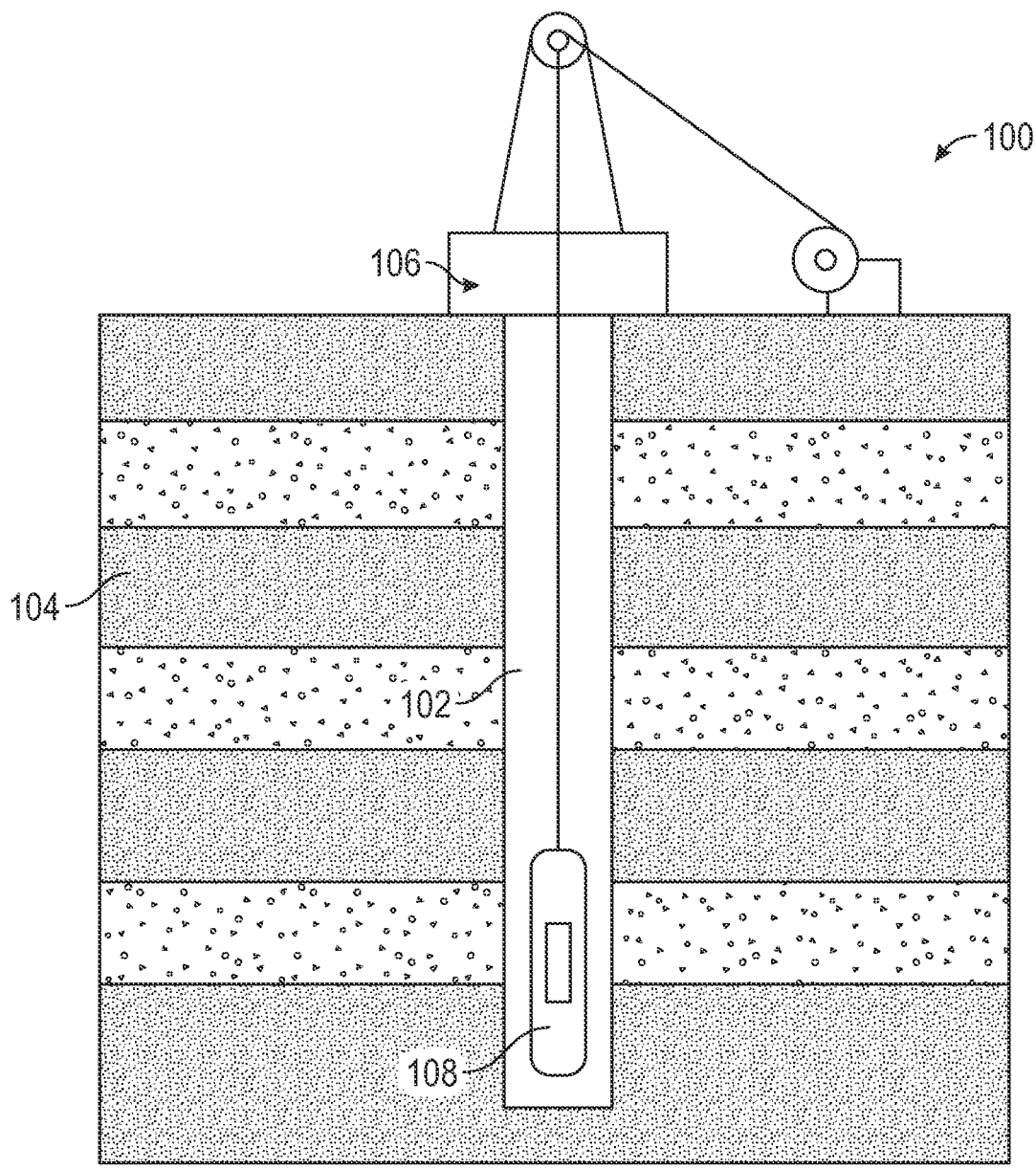
FIG. 1 shows a well logging device for collecting well log data, according to one or more embodiments.

FIG. 1 shows a well logging device 100 for collecting well log data of well properties in accordance with one or more embodiments. A wellbore 102 penetrates a formation 104. A winch 106 lowers a well logging tool 108 into the wellbore 102. The well logging tool 108 collects the well logging data while being lowered into the wellbore 102. Well logs may provide depth measurements of the wellbore (102) that describe such reservoir characteristics as formation porosity, formation permeability, water saturation, gamma ray, density, resistivity, compressional wave transit time, shear wave transit time, temperature, caliper, and the like. The resulting logging measurements may be stored or processed or both, for example, by a control system or a computer processor, to generate corresponding well logs for the well. A well log may include, for example, a plot of a logging response time versus true vertical depth (TVD) across the depth interval of the wellbore (102). The well logging data are used as well properties for the method for predicting a formation property which is described in FIG. 2.

Figure 2:
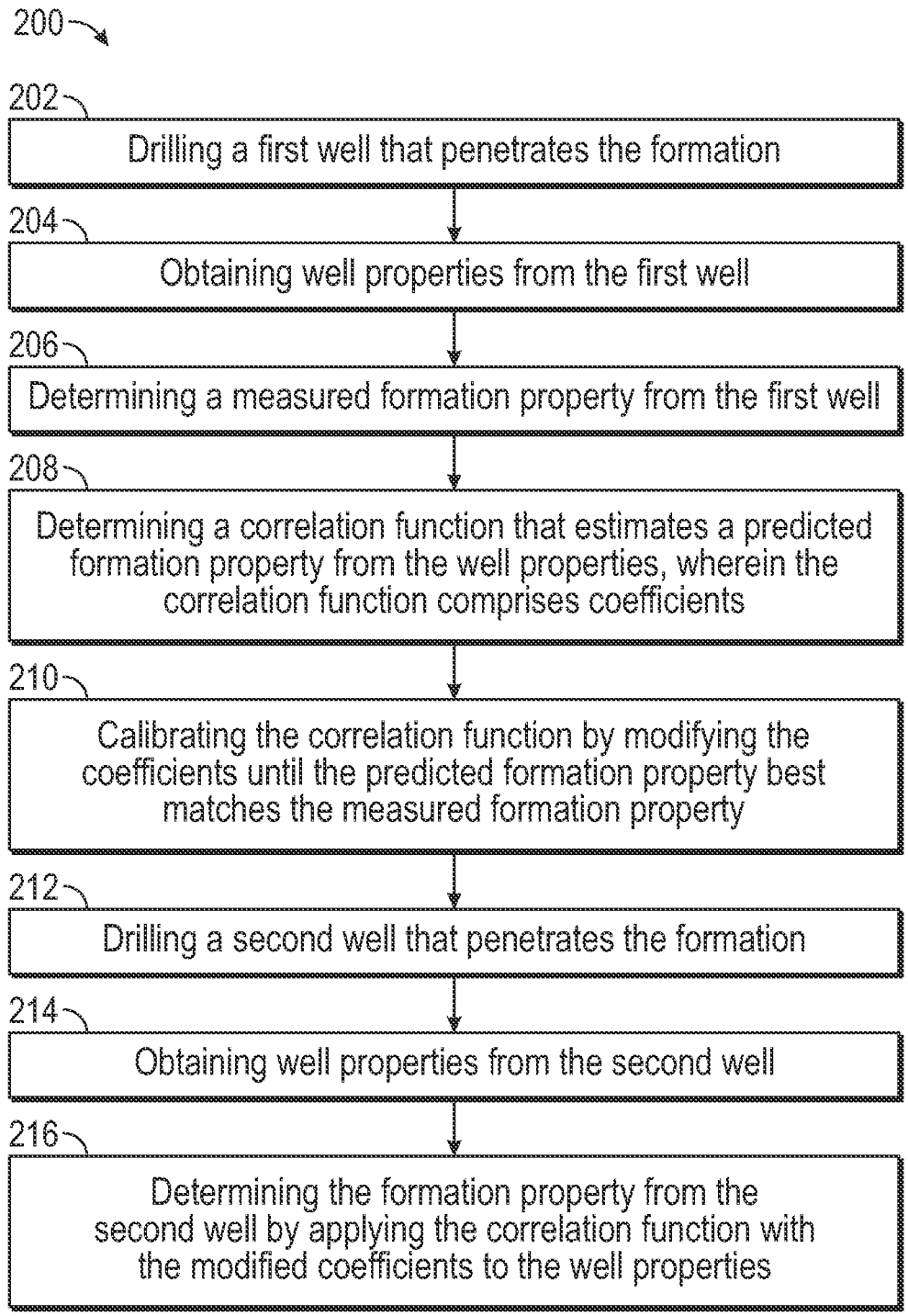
FIG. 2 shows a flowchart 200 of the method steps for predicting a formation property of a formation, according to one or more embodiments.

FIG. 2 shows a flowchart 200 of the method steps for predicting a formation property of a formation. The flowchart 200 includes the following steps.

In step 202, a first well is drilled that penetrates the formation. The first well is drilled in a first region of the formation.

In step 204, well properties from the first well are obtained. Well properties may include well logging data as described above. For example, well properties may include gamma ray, porosity, density, resistivity, compressional wave transit time, shear wave transit time, temperature, and caliper, sonic transit time dt (μs/ft) and density acquired from drilled wells.

In step 206, a measured formation property from the first well is determined. Step 206 may involve obtaining lab or field data of the formation property of interest at different depths. For example, unconfined compressive strength (UCS) of a rock specimen may be measured in the lab using the triaxial test. Generally, if a correlation has k parameters, then lab/field measurements of the formation property at least k depths are needed. The formation property is not limited to UCS and may include in-situ stresses & pore pressure, elastic properties, poroelastic properties, rock strength properties, Young's modulus, Poisson's ratio, undrained Poisson's ratio, cohesion, friction angle, minimum horizontal stress, pore pressure, permeability, Biot's coefficient, and/or volumetric thermal expansion coefficient.

In step 208, a correlation function is determined that estimates a predicted formation property from the well properties. The correlation function includes coefficients. The coefficients are initially determined using well properties and formation properties of a well drilled in a specific region of a possibly different formation. As such, the initial values for the coefficients may not be appropriate for the present formation of interest.

A correlation between the well properties and the formation properties describes a dependence or relationship of the formation properties from the well properties. The correlation is a statistical association and refers to the degree of a linear or nonlinear relationship between the well properties and the formation properties. The correlation uses well logs as input. A correlation function is a function $f$ that maps the well properties, e.g., sonic transit time (dt), to a formation property, e.g., unconfined compressive strength (UCS).

Method for Determining Correlation Functions

The following discussion expands on step 208. The correlation y between the well properties and the formation property is $$y = f(x, \theta) \tag{1}$$

where $y \in \mathbb{R}$, $x = [x_1, x_2, \ldots, x_n]^T \in \mathbb{R}^n$ is a vector of the well properties (well property vector), $\theta = [\theta_1, \theta_2, \ldots, \theta_p]^T \in \mathbb{R}^p$ is a vector of the coefficients (coefficient vector), and $f: \mathbb{R}^n \times \mathbb{R}^p \to \mathbb{R}$ is a correlation function that maps the well property vector and the coefficient vector to the correlation y, which indicates the correlation to the formation property, e.g., UCS.

In a calibration process, the coefficient vector $\theta$ is updated so that the correlation y closely matches the measured formation property.

The gradient of the correlation function $f$ is a gradient vector of all of first partial derivatives of the correlation function $f$ with respect to the coefficients, i.e., $$\nabla_\theta f(x, \theta) = \left[ \frac{\partial f}{\partial \theta_1}, \frac{\partial f}{\partial \theta_2}, \ldots, \frac{\partial f}{\partial \theta_p} \right] \tag{2}$$

where $$\frac{\partial f}{\partial \theta_i}$$

is the partial derivative of the correlation function $f$ with respect to the coefficient $\theta_i$. The calibration process modifies only the coefficient vector $\theta$. $\nabla_\theta f(x, \theta)$ is important because it is used in equation (8) which in turn is used in equation (7) to modify the coefficient vector $\theta$.

The correlation function has a unique implementation. The correlation function stores the code to programmably execute the correlation function. That means for a given well property vector x and a given coefficient vector $\theta$, a computer program executes the code in the correlation function $f(x, \theta)$ to output the predicted formation property. The correlation gradient function stores the code to programmatically execute the gradient vector $\nabla_\theta f(x, \theta)$. That means for a given well property vector x and a given coefficient vector $\theta$, a computer program executes the code in a correlation gradient function to execute the gradient vector $\nabla_\theta f(x, \theta)$.

In one or more embodiments, the code for the correlation function $f$ and the correlation gradient function are written in any suitable programming language, e.g., Python, Javascript, C#, Java, and call external software libraries. The code for the correlation gradient function is optional. If the correlation gradient function is not specified, the gradient vector $\nabla_\theta f(x, \theta)$ is approximated using finite element method.

The following three equations (3) to (5) are examples of three correlation functions that correlate two well properties to the formation property, the unconfined compressive strength UCS (MPa) in this case, wherein the well properties are sonic transit time dt (µs/ft) and density ρ(g/cc).

$$UCS = a_1 \times \left(\frac{304.8}{dt}\right)^{b1} \quad (3)$$

$$UCS = a_2 \times \left(\frac{304.8}{dt} - b_2\right) \quad (4)$$

$$UCS = a_3 \times e^{b_3 \times \rho \times \left(\frac{304800}{dt}\right)^2} \quad (5)$$

wherein $(a_1, b_1)$, $(a_2, b_2)$, $(a_3, b_3)$ are the coefficients of the correlation functions.

As mentioned above, to apply the correlation function $f$ to wells in a different region, the correlation function $f$ requires calibration. Continuing with FIG. 2, in step 210, the correlation function is calibrated by modifying the coefficients until the predicted formation property best matches the measured formation property. The predicted formation property best matches the measured formation property in case the convergence criteria are fulfilled. The convergence criteria are describes in FIG. 4 (see step 410).

The calibration modifies the coefficients of the correlation function $f$ such that the predicted formation property best matches the measured formation property (called true formation property value). The coefficients are modified until the predicted formation property best matches the measured formation property and the convergence criteria are fulfilled (see step 410 in FIG. 4).

Regarding the correlation equation mentioned in Eq. (3), the initial coefficients are $(a_1, b_1)=(0.77, 2.93)$, $(a_2, b_2)=(10, 1)$, $(a_3, b_3)=(3.87, 1.14\times10^{-10})$. The coefficients $(a_1, b_1)$, $(a_2, b_2)$, $(a_3, b_3)$ are calibrated during the method for predicting a formation property of a formation. For example, using the procedure in FIG. 4, the coefficients $a_1$ and $b_1$ in equation (3) are automatically calibrated such that the UCS values predicted by equation (3) best match the lab measurements of the UCS values.

In step 212, a second well is drilled that penetrates the formation. The second well is drilled in a second region of the same formation. Thus, the region of the first well is different than the region of the second well. However, the first and second well are drilled in the same formation.

In step 214, well properties from the second well are obtained.

In step 216, the formation property associated with the second well is determined by applying the correlation function with the modified coefficients to the well properties. Thus, in step 216, the calibrated correlation function obtained from previous steps of the method is used to predict the formation property associated with a new well.

Those skilled in the art will appreciate that the process of FIG. 2 may be repeated for each formation property that needs to be estimated.

Figure 3:
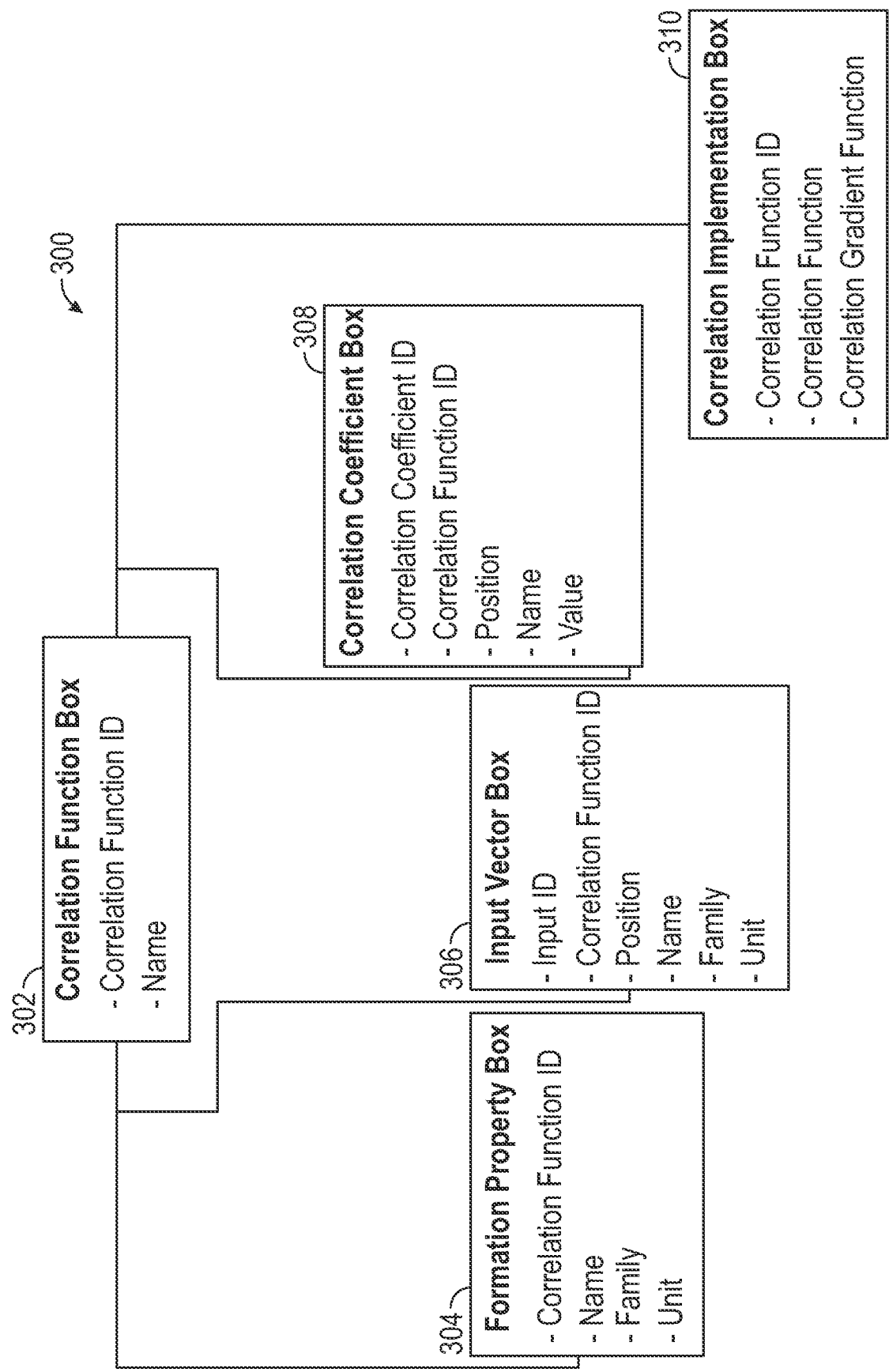
FIG. 3 shows a database stored on a computer, according to one or more embodiments.

To enable automated calibration, the correlation function needs to be specified so that a computer program may execute and evaluate the correlation function. The essential information about the output, inputs, and coefficients components of a correlation and its implementation is specified and stored in a database as shown in FIG. 3. The database 300 may be stored on any computing device with memory such as that shown and described in FIG. 8 below. The database 300 is configured to store various schema for the correlation specification. The schema includes a correlation function box 302, a formation property box 304, an input vector box 306, a correlation coefficient box 308, and a correlation implementation box 310.

The correlation function box 302 includes a correlation function ID that uniquely identifies each correlation function, and a name that is stored in the correlation function box 302.

The formation property box 304 includes the correlation function ID, a name, a family of the predicted formation property (e.g., UCS), and a unit of the family (e.g., MPa). The family attribute is used to group the correlation functions by family. Each predicted formation property is associated with a correlation function through the correlation function ID. A correlation function has only one output since the correlation function ID also serves as an output. In other words, each correlation output is associated with a correlation through the correlation function ID.

The input vector box 306 includes an input ID, correlation function ID, a name, a family (e.g., Vp), and a unit (e.g., m/s). An input has a unique input ID and is associated with a correlation function through the correlation function ID. A correlation function has many inputs and the order of the inputs the vector x of Eq. (1) is determined through the position attribute in the input vector box 306.

The correlation coefficient box 308 includes a correlation coefficient ID, a correlation function ID, a position, a name, and a value. A correlation coefficient has its own unique correlation coefficient ID and is associated with a correlation function through the correlation function ID. A correlation function can have more than one coefficient and the order of the coefficients in the coefficient vector θ of Eq. (1) is determined through the position attribute in the correlation coefficient box 308. The name and value are set to an initial value.

The correlation implementation box 310 includes a correlation function ID, correlation function, and correlation gradient function.

In one or more embodiments, the correlation function box 302, the formation property box 304, and the correlation implementation box 310 may be combined/merged into one total box.

The database 300 allows users to (a) use correlation functions to estimate formation properties, (b) specify and save new correlation equations, and (c) calibrate correlation functions.

Figure 4:
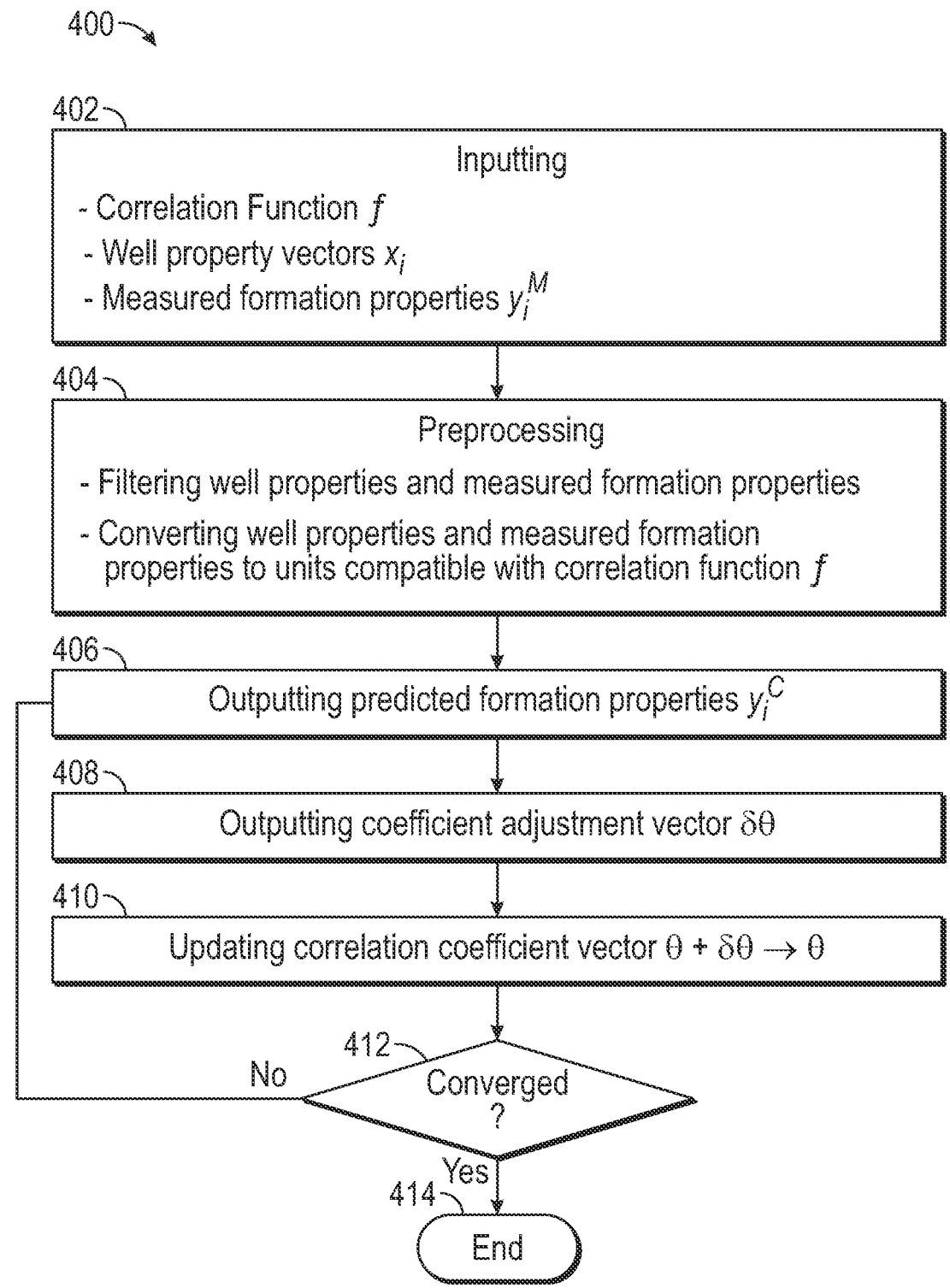
FIG. 4 shows an iterative process for automated calibration of the correlation function.

FIG. 4 shows an iterative process 400 for automated calibration of the correlation function. The iterative process 400 is a detailed description of the step 210 in FIG. 2.

For a given a correlation y and the measured formation property, the calibration modifies the correlation coefficient vector θ such that the predicted formation properties best match the measured formation properties. This is solved as an optimization problem using different techniques. Any optimization method is applicable. The procedure 400 for automated calibration of the correlation function is described in the following.

Given a correlation equation (e.g., Eq. (3)), input well logs (e.g., dt), field/lab data (e.g., core measurements UCS), an automated calibration algorithm automatically finds the best coefficients for the correlation equation. The errors between the field/lab measurements and the correlation equation are minimized.

In step 402, the correlation function $f$, well property vectors $x_i$, and measured formation properties $y_i^M$ are inputted to the procedure 400.

In step 404, the well property vector $x_i$ and the measured formation property vector $y_i^M$ are filtered and converted to units that are compatible with the correlation function $f$. This step is a preprocessing step.

In step 406, the predicted formation properties $y_i^C$ are outputted.

In step 408, a coefficient adjustment vector $\delta\theta$ is outputted by the procedure 400. The coefficient adjustment vector $\delta\theta$ is determined as follows. Assuming there are k well property vectors: $x_1, x_2, \ldots, x_k$. Consequently, the correlation function $f(x, \theta)$ outputs k predicted formation properties $y_1^C, y_2^C, \ldots, y_k^C$, i.e, $$y_1^C = f(x_1, \theta) \quad (6)$$
$$y_2^C = f(x_2, \theta)$$
$$\vdots$$
$$y_k^C = f(x_k, \theta)$$

Further assuming there are k measured formation properties $y_1^M, y_2^M, \ldots, y_k^M$ corresponding to the k well property vectors $x_1, x_2, \ldots, x_k$. In the context of formation properties, the measured formation properties $y_1^M, y_2^M, \ldots, y_k^M$ are obtained from core plugs or drill cuttings. For example, $y_i^M$ are measured formation properties from core plugs at k different depths.

The adjustment vector $\delta\theta=[\delta\theta_1, \delta\theta_2, \ldots, \delta\theta_p]$ adjusts the coefficient vector $\theta$ such that the adjusted coefficients $(\theta+\delta\theta)$ yields the optimal predicted formation property y that best matches the measured formation property. Applying the forward sensitivity method, the optimal adjustments $\delta\theta$ is:

$$\delta\theta = (A^T A)^{-1} A^T b, \quad (7)$$

where $$A = \begin{bmatrix} \nabla_\theta f(x_1, \theta) \\ \nabla_\theta f(x_2, \theta) \\ \vdots \\ \nabla_\theta f(x_k, \theta) \end{bmatrix} \quad (8)$$

and $$b = \begin{bmatrix} y_1^M - y_1^C \\ y_2^M - y_2^C \\ \vdots \\ y_k^M - y_k^C \end{bmatrix} \quad (9)$$

In step 410, the correlation coefficient vector is updated $\theta+\delta\theta \rightarrow \theta$. The optimization process is iterated, i.e, the coefficient vector $\theta+\delta\theta \rightarrow \theta$ is updated then equations (6) and (7) are repeated until convergence criteria are fulfilled.

The length of the adjustment vector $\delta\theta$ is defined as: $|\delta\theta| = \sqrt{\delta\theta_1^2 + \ldots + \delta\theta_p^2}$. The errors between $y_i^C$ and $y_i^M$ get smaller after each iteration. Therefore, the length of the adjustment vector $\delta\theta$ gets smaller. Furthermore, the vector b in equation (9) gets smaller and the adjustment vector $\delta\theta$ in equation (7) gets smaller as well.

The convergence criteria include that the length of the adjustment vector $\delta\theta$ is smaller than a threshold, or that the improvement to a performance metric measuring the match between the predicted formation properties $y_i^C$ and the measured formation properties $y_i^M$ is smaller than a threshold, or both. Popular metrics such as mean squared error (MSE), mean absolute error (MAE), mean absolute percentage error (MAPE), coefficient of determination ($R^2$) are used. The MSE measures the average of squares of the errors between the measured formation properties and the predicted formation properties. The MSE is always positive and decreases as the error approaches zero. The MAE is a measure of errors between a pair comprising a measured formation property value and a predicted formation property value. Thus, the MAE is an arithmetic average of the absolute errors between the measured formation property value and the corresponding predicted formation property value.

In step 412, the convergence is controlled.

If the convergence criteria are fulfilled, then the procedure ends in step 414. If the convergence criteria are not fulfilled, then steps 406, 408, and 410 are repeated until the convergence criteria are fulfilled and the procedure ends in step 414.

Figure 5:
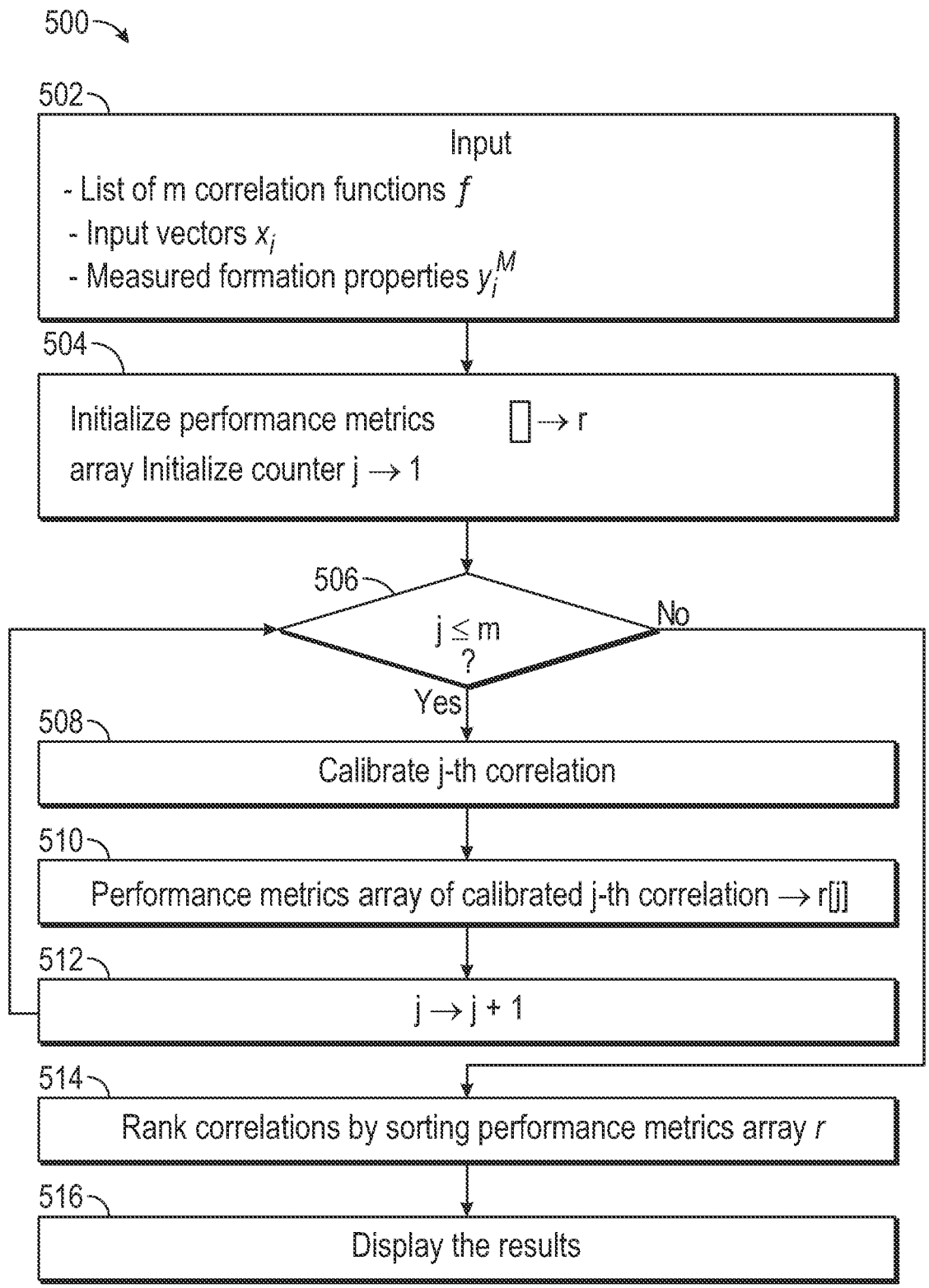
FIG. 5 shows a procedure for automated calibration and ranking of correlation functions.

FIG. 5 shows a procedure 500 for automated calibration and ranking of correlation functions. Specifically, in step 208 above in FIG. 2, when there is only one correlation function then that single correlation function's coefficients are optimized (i.e., calibrated). When there exist more than one correlation in step 208, the group of correlation functions are calibrated and then ranked so that the best one may be chosen.

In step 502, the list of m of correlation functions $f$, the well property vectors $x_i$, and measured formation properties $y_i^M$ are inputted to the procedure 500.

In case there are more than one correlation function selected to predict the formation property, all correlation functions are calibrated on the same measured formation property in order to determine which correlation function works best. This is automated by running the automated calibration according to the description of FIG. 4 for each correlation function, then ranking the correlation functions based on a performance metric such as MSE, MAE, MAPE, or $R^2$. The resulting calibrated predictions, their metric scores, and the measured data are plotted to visualize the differences.

In step 504, the performance metrics array r and the counter are initialized ($[\,] \rightarrow r$, $j \rightarrow 1$). The counter j is initialized to 1 to mark that the procedure is processing the first correlation next. The performance metrics array holds the performance metrics of all correlations being ranked. That is, the i-th element of the array that holds the performance metric for the i-th correlation.

In step 506, it is checked if $j \leq m$. In case of Yes, i.e., there are still correlation functions to calibrate and calculate performance metric, step 508 is performed. In case of No, i.e., we have processed all correlation functions, step 514 is performed.

In step 508, the j-th correlation is calibrated according to the description of FIG. 4.

In step 510, the performance metric of calibrated j-th correlation $\rightarrow r[j]$.

In step 512, $j \times j+1$, i.e., move to the next correlation function.

In step 514, the correlation functions are ranked by sorting the performance metrics array r. There may be multiple correlation functions for each formation property, e.g., equations (3) to (5) for UCS. A user may want to choose the best correlation function to estimate the formation property. Ranking the correlations after calibration helps the user do that. In one or more embodiments, only correlations that predict the same formation property are ranked. Correlations that predict different formation properties are not ranked.

A group of correlation functions may be ranked based on the performance of each correlation function. In one or more embodiments, the ranking of the correlation functions is performed as follows. Each correlation function is assigned a score based on a performance metric such as mean squared error (MSE), mean absolute error (MAE), mean absolute percentage error (MAPE), or coefficient of determination ($R^2$). The correlation functions are ranked based on their scores.

In step 516, the results are displayed. For example, the results may be displayed on a display of a computer system such as that discussed in FIG. 8 below.

Figure 6:
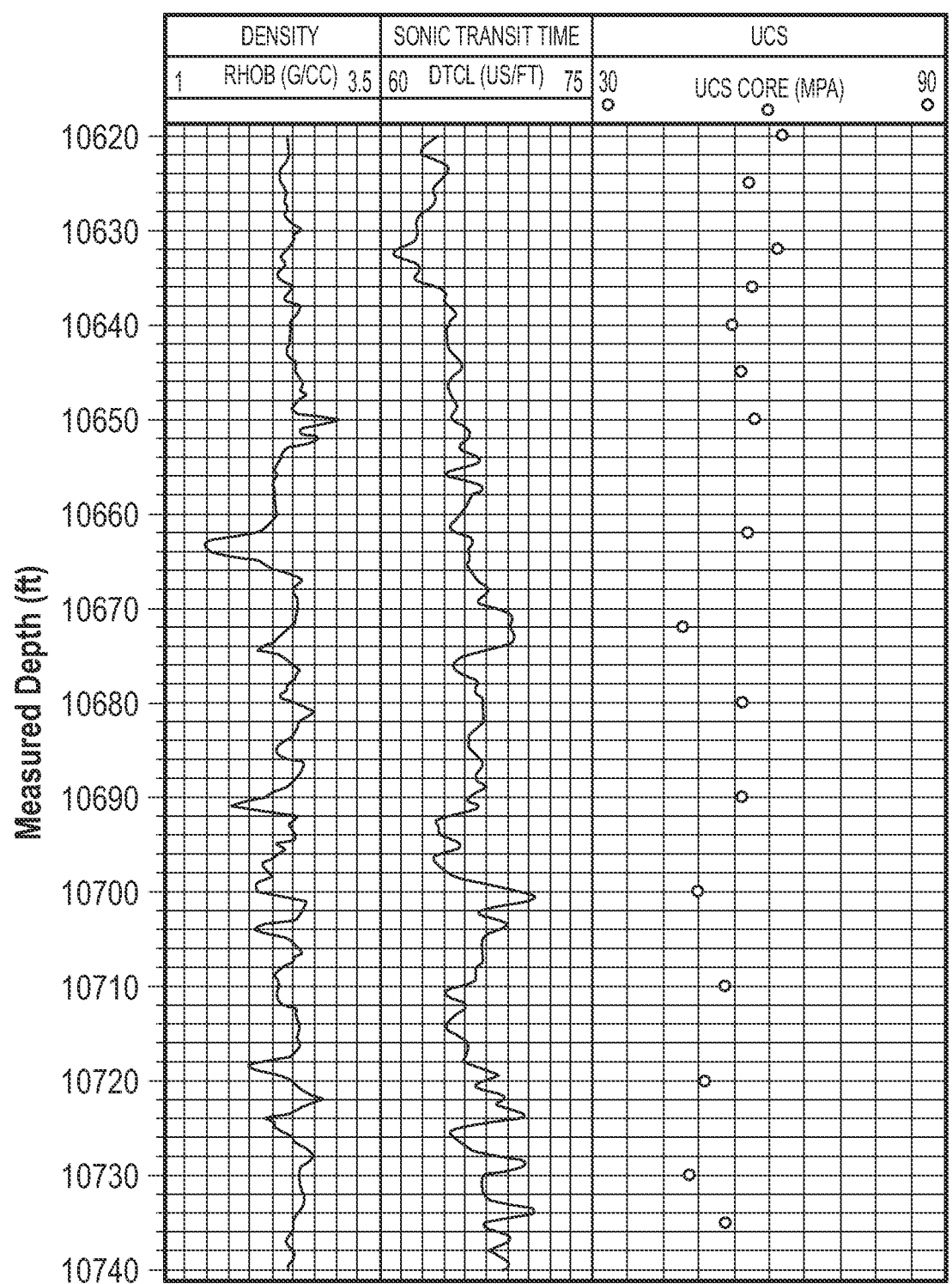
FIG. 6 shows plotted logs of well properties and a formation property.

FIG. 6 shows plotted logs of well properties and a formation property. The well properties include a density log (RHOB, in gram per cubic centimeter g/cc), and a compressional wave sonic transit time log (DTCL, in microsecond per feet μs/ft.). The formation property includes the core measurements of the UCS in mega Pascale (MPa). The well properties and the UCS are measured along the depth of the well between 10620 and 10740 ft.

Figure 7:
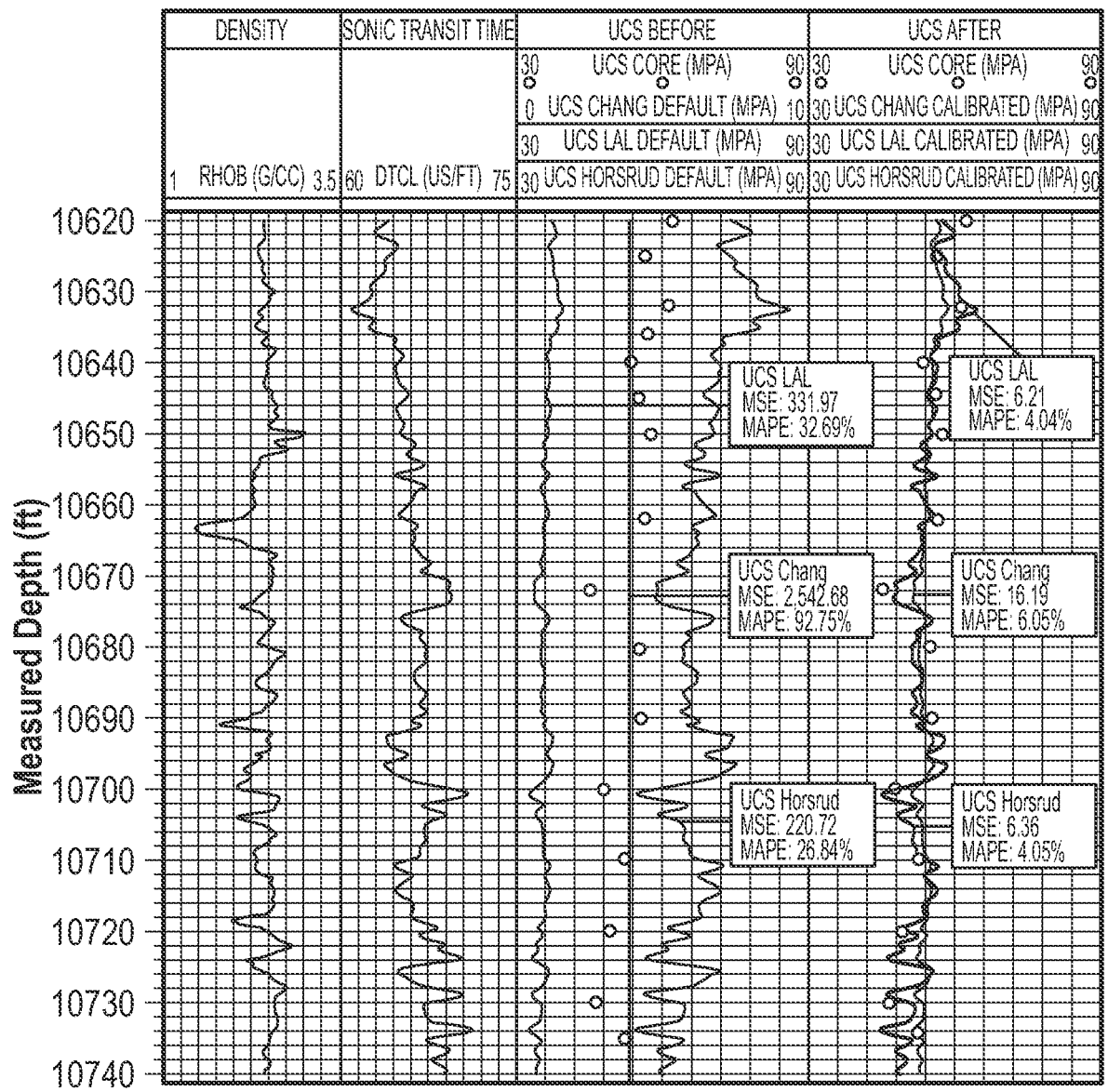
FIG. 7 shows plotted logs of the correlated UCS using the calibrated coefficients.

FIG. 7 shows the plotted logs of FIG. 6 and different correlation functions added to the measured formation property, UCS in this case. "UCS Before" shows the measured UCS values and three different correlation functions with default coefficients that are not calibrated automatically. With the default coefficients, none of the correlation functions match well to the measured UCS values. "UCS After" shows the same measured UCS values and the same three correlation functions with automated calibration of the coefficients. After the automated calibration of the coefficients, the correlation functions match better to the measured UCS Values. The ranking of the correlation functions ranges from best to worst using MSE metric.

Figure 8:
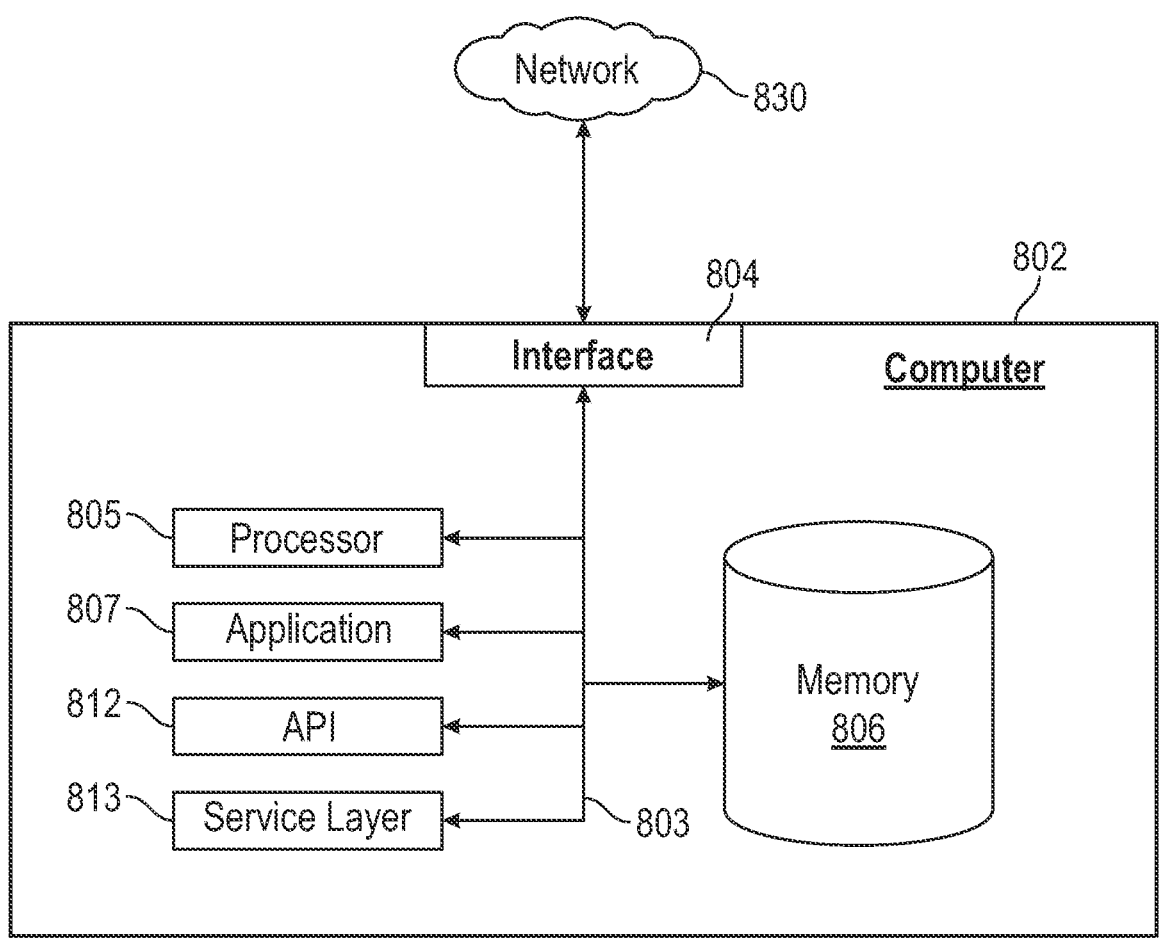
FIG. 8 shows a computer system in accordance with one or more embodiments.

FIG. 8 is a block diagram of a computer system 802 used to provide computational functionalities associated with the method for predicting sand production in a formation.

The illustrated computer system 802 is intended to encompass any computing device such as a high performance computing (HPC) device, a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer system 802 comprises a computer that comprises an input device, such as a keypad, keyboard, touch screen, or other device that can accept user information, and an output device that conveys information associated with the operation of the computer system 802, including digital data, visual, or audio information (or a combination of information), or a GUI.

The computer system 802 serves in a role as a client, network component, a server, a database or other persistency, or any other component (or a combination of roles) of a computer system for performing the subject matter described in the instant disclosure. The illustrated computer system 802 is communicably coupled with a network 830 or cloud. In some implementations, one or more components of the computer system 802 are configured to operate within environments, including cloud-computing-based, local, global, or other environment (or a combination of environments).

At a high level, the computer system 802 is an electronic computing device operable to receive, transmit, process, store, or manage data and information associated with the described subject matter. According to some implementations, the computer system 802 also comprises or is communicably coupled with an application server, e-mail server, web server, caching server, streaming data server, business intelligence (BI) server, or other server (or a combination of servers).

The computer system 802 receives the correlation functions over a network 830 or cloud from a client application (for example, executing on another computer system 802 and responding to the received requests by processing the said requests in an appropriate software application. In addition, requests may also be sent to the computer system 802 from internal users (for example, from a command console or by other appropriate access method), external or third-parties, other automated applications, as well as any other appropriate entities, individuals, systems, or computers.

Each of the components of the computer system 802 communicates using a system bus 803. In some implementations, any or all of the components of the computer system 802, both hardware or software (or a combination of hardware and software), may interface with each other or the interface 804 (or a combination of both) over the system bus 803 using an application programming interface (API) 812 or a service layer 813 (or a combination of the API 812 and service layer 813. The API 812 comprises specifications for routines, data structures, and object classes. The API 812 is either computer-language independent or dependent and refer to a complete interface, a single function, or even a set of APIs. The service layer 813 provides software services to the computer system 802 or other components (whether or not illustrated) that are communicably coupled to the computer system 802. The functionality of the computer system 802 is accessible for all service consumers using this service layer. Software services, such as those provided by the service layer 813, provide reusable, defined business functionalities through a defined interface. For example, the interface is software written in JAVA, C++, or other suitable language providing data in extensible markup language (XML) format or other suitable format. While illustrated as an integrated component of the computer system 802, alternative implementations may illustrate the API 812 or the service layer 813 as stand-alone components in relation to other components of the computer system 802 or other components (whether or not illustrated) that are communicably coupled to the computer system 802. Moreover, any or all parts of the API 812 or the service layer 813 are implemented as child or sub-modules of another software module, enterprise application, or hardware module without departing from the scope of this disclosure.

The computer system 802 comprises an interface 804. Although illustrated as a single interface 804 in FIG. 8, two or more interfaces 804 are used according to particular needs, desires, or particular implementations of the computer system 802. The interface 804 is used by the computer system 802 for communicating with other systems in a distributed environment that are connected to the network 830. Generally, the interface 804 comprises logic encoded in software or hardware (or a combination of software and hardware) and operable to communicate with the network 830 or cloud. More specifically, the interface 804 comprises software supporting one or more communication protocols associated with communications such that the network 830 or interface's hardware is operable to communicate physical signals within and outside of the illustrated computer system 802.

The computer system 802 comprises at least one computer processor 805. Although illustrated as a single computer processor 805 in FIG. 8, two or more processors are used according to particular needs, desires, or particular implementations of the computer system 802. Generally, the computer processor 805 executes instructions according to the trained model and manipulates the correlation functions to perform the operations of the computer system 802 and any algorithms, methods, functions, processes, flows, and procedures as described in the instant disclosure to output the CDP, that indicates the sand production in the formation.

The computer system 802 also comprises a memory 806 that holds the correlation functions for the computer system 802 or other components (or a combination of both) that is connected to the network 830. For example, the memory 806 is a database storing the correlation functions consistent with this disclosure. Although illustrated as a single memory 806 in FIG. 8, two or more memories are used according to particular needs, desires, or particular implementations of the computer system 802 and the described functionality. While memory 806 is illustrated as an integral component of the computer system 802, in alternative implementations, memory 806 is external to the computer system 802.

The application 807 is an algorithmic software engine providing functionality according to particular needs, desires, or particular implementations of the computer system 802, particularly with respect to functionality described in this disclosure. For example, application 807 serves as one or more components, modules, applications, etc. Further, although illustrated as a single application 807, the application 807 is implemented as multiple applications 807 on the computer system 802. In addition, although illustrated as integral to the computer system 802, in alternative implementations, the application 807 is external to the computer system 802.

There are any number of computers 802 associated with, or external to, a computer system containing computer system 802, each computer system 802 communicating over network 830. Further, the term "client," "user," and other appropriate terminology are used interchangeably as appropriate without departing from the scope of this disclosure. Moreover, this disclosure contemplates that many users may use one computer system 802, or that one user may use multiple computers 802.

In some embodiments, the computer system 802 is implemented as part of a cloud computing system. For example, a cloud computing system comprises one or more remote servers along with various other cloud components, such as cloud storage units and edge servers. In particular, a cloud computing system may perform one or more computing operations without direct active management by a user device or local computer system. As such, a cloud computing system may have different functions distributed over multiple locations from a central server, which are performed using one or more Internet connections. More specifically, a cloud computing system may operate according to one or more service models, such as infrastructure as a service (IaaS), platform as a service (PaaS), software as a service (SaaS), mobile "backend" as a service (MBaaS), artificial intelligence as a service (AIaaS), serverless computing, and/or function as a service (FaaS).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A method for predicting a formation property of a formation, comprising the steps of:
   drilling a first well that penetrates the formation,
   obtaining well properties from the first well,
   determining a measured formation property from the first well,
   determining a correlation function that estimates a predicted formation property from the well properties, wherein the correlation function comprises coefficients,
   calibrating the correlation function by modifying the coefficients until the predicted formation property best matches the measured formation property,
   drilling a second well that penetrates the formation,
   obtaining well properties from the second well,
   determining the formation property from the second well by applying the correlation function with the modified coefficients to the well properties,
   using, by a wellbore stability model, the formation property to plan an optimal well trajectory of the second well,
   using the formation property to plan a mud program that minimizes instabilities of the second well;
   using the formation property to recommend an optimal lost circulation material (LCM) blend to mitigate mud loss in the second well, and
   drilling the second well,
   wherein the coefficients for k correlation functions are modified by the following steps:
   determining a coefficient adjustment vector for k well property vectors,
   outputting k predicted formation properties by the correlation function, $$y_1^C = f(x_1, \theta) \qquad (3)$$
$$y_2^C = f(x_2, \theta)$$
$$\vdots$$
$$y_k^C = f(x_k, \theta)$$

determining k measured formation properties corresponding to the k well property vectors, and
   adjusting the coefficient vector such that the adjusted coefficients yields the optimal predicted formation property that best matches the measured formation property.

2. The method according to claim 1, wherein the well properties are determined in the lab or at the well.

3. The method according to claim 1, wherein the formation property comprises unconfined compressive strength (UCS).

4. The method according to claim 3, wherein the UCS is determined in a lab from a core sample using the triaxial test.

5. The method according to claim 1, wherein the formation property further comprise in-situ stresses & pore pressure, elastic properties, poroelastic properties, rock strength properties, Young's modulus, Poisson's ratio, undrained Poisson's ratio, cohesion, friction angle, minimum horizontal stress, pore pressure, permeability, Biot's coefficient, and volumetric thermal expansion coefficient.

6. The method according to claim 1, wherein the well property comprises gamma ray, porosity, density, resistivity, compressional wave transit time, shear wave transit time, temperature, and caliper.

7. The method according to claim 1, wherein the well properties, the formation properties, the correlation functions, and the coefficients are stored in a database of a computer.

8. The method according to claim 1, wherein several correlation functions are determined, and one correlation function is selected that estimates a predicted formation property from the well properties.

9. The method according to claim 8, wherein the selected correlation function is selected based on a ranking of the correlation functions.

10. The method according to claim 9, wherein the ranking is performed by a score based on a performance metric assigned to each correlation function.

11. The method according to claim 10, wherein the performance metric comprises mean squared error (MSE), mean absolute error (MAE), mean absolute percentage error (MAPE), or coefficient of determination ($R^2$).

12. The method according to claim 1, wherein the coefficient vector is adjusted by an adjustment vector, and the adjustment vector is determined by $\delta\theta=(A^TA)^{-1}A^Tb$, where $$A = \begin{bmatrix} \nabla_\theta f(x_1, \theta) \\ \nabla_\theta f(x_2, \theta) \\ \vdots \\ \nabla_\theta f(x_k, \theta) \end{bmatrix}, \text{ and} \quad (4)$$

$$b = \begin{bmatrix} y_1^M - y_1^C \\ y_2^M - y_2^C \\ \vdots \\ y_k^M - y_k^C \end{bmatrix}.$$

13. The method according to claim 12, wherein the coefficient vector is updated iteratively by repeating Eq. (3) and (4).

14. The method according to claim 13, wherein Eq. (3) and (4) are repeated until the length of the adjustment vector is smaller than a threshold, or until the improvement to a performance metric measuring the match between the predicted formation properties and the measured formation properties is smaller than a threshold.

15. The method according to claim 14, wherein the performance metric comprises mean squared error (MSE), mean absolute error (MAE), mean absolute percentage error (MAPE), coefficient of determination ($R^2$) are used.

16. The method according to claim 1, wherein the measured formation property is determined from core plugs or drill cuttings.

* * * * *